United States Patent [19]
Bestwick et al.

[11] Patent Number: 5,888,844
[45] Date of Patent: Mar. 30, 1999

[54] METHOD OF ETCHING SEMICONDUCTOR LASER DEVICE HAVING $AL_XGA_{1-X}AS$ AND $AL_VGA_{1-(V+Y)}IN_YP$ COMPOUND

[75] Inventors: Timothy David Bestwick, Oxford; Craig Tombling, Oxfordshire, both of United Kingdom

[73] Assignee: Sharp Kabushiki Kaisha, Osaka, Japan

[21] Appl. No.: 806,909

[22] Filed: Feb. 26, 1997

[30] Foreign Application Priority Data

Feb. 28, 1996 [GB] United Kingdom .................... 9604189

[51] Int. Cl.$^6$ .................................................. H01L 21/00
[52] U.S. Cl. ................................ 438/46; 438/40; 438/41; 438/706; 148/DIG. 95
[58] Field of Search .................................. 438/46, 28, 39, 438/40, 41, 689, 706, 388, 117, 120; 148/DIG. 95

[56] References Cited

U.S. PATENT DOCUMENTS

| | | | |
|---|---|---|---|
| 5,300,452 | 4/1994 | Chang et al. | 437/126 |
| 5,338,394 | 8/1994 | Fathimulla et al. | 156/643 |
| 5,538,918 | 7/1996 | Haase et al. | 437/127 |
| 5,663,976 | 9/1997 | Razeghi | 372/46 |
| 5,726,078 | 3/1998 | Razeghi | 438/39 |

FOREIGN PATENT DOCUMENTS

| | | |
|---|---|---|
| 0547694 | 12/1991 | European Pat. Off. . |
| 0607662 | 11/1993 | European Pat. Off. . |
| 634823 A1 | 1/1995 | European Pat. Off. . |
| 4180684 | 6/1992 | Japan . |
| 5-7050 | 1/1993 | Japan . |

OTHER PUBLICATIONS

M. B. Stern et al., J. Vac. Sci. Technol., vol. B1, No. 4, pp. 1053–1055, 1983, "Reactive Ion Etching of GaAs and InP Using $SiCl_4$".

M. Shono et al., Electronics Letters, vol. 29, No. 11, pp. 1010–1011, 1993, "High–Power Operation of 630nm–Band Tensile Strained Multiquantum–Well AlGaInP Laser Diodes with Multiquantum Barrier".

T. Yoshikawa et al., Electronics Letters, vol. 30, No. 24, pp. 2035–2037, 1994, "Dry–Etched 650 AlGaInP Visible–Light Laser Diodes with Operating Time of Over 3000h".

T. Yoshikawa et al., Electronics Letters, vol. 29, No. 19, pp. 1690–1691, 1993, "GaInP/AlGaInP Index Waveguide–Type Visible Laser Diodes with Dry–Etched Mesa Stripes".

ER.J. Shul et al., Electronics Letters, vol. 30, No. 10, pp. 817–819, 1994, "Anisotropic Electron Cyclotron Resonance Etching of GaInP/AlGaInP Heterostructures".

QO 35590PEP Jul. 7, 1997 European Search Report.

Chang et al., "Reactive Ion Etching Of AlInGaP And GaAs in $SiCl_4$/$CH_4$/Ar–based Plasmas", Journal Of Vacuum Science and Technology: Part B, vol. 12, No. 2 (Mar. 1994), pp. 536–539.

Collot et al., "Dry–Etch Monitoring Of III–V Heterostructures Using Laser Reflectometry And Optical Emission Spectroscopy", Journal Of Vacuum Science And Technology: Part B, vol. 9, No. 5 (Sep. 1991), pp. 2497–2502.

Yoshikawa et al., "650 nm AlGaInP Visible Light Laser Diode With Dry–Etched Mesa Stripe", Japanese Journal Of Applied Physics, vol. 34, No. 2B (Feb. 1995), pp. 1273–1278.

Hong et al., "Interfacial Characteristics of AlGaAs After In Situ Electron Cyclotron Resonance Plasma Etching And Molecular Beam Epitaxial Regrowth", Journal of Applied Physics, vol. 75, No. 6 (Mar. 1994), pp. 3106–3111.

Pearton et al., "Science Of Dry Etching Of III–V Materials", Journal Of Materials Science: Materials In Electronics, vol. 5, No. 1, (Feb. 1994), pp. 1–12.

*Primary Examiner*—Peter Toby Brown
*Assistant Examiner*—Long Pham
*Attorney, Agent, or Firm*—Renner, Otto, Boisselle & Sklar

[57] ABSTRACT

An (Al,Ga)As/(Al,Ga,In)P semiconductor layer structure is etched using an $SiCl_4$ or an $SiCl_4$/(He,Ne) plasma. The etching is carried out at 0° to 80° C. and at a plasma pressure below $1.33 \times 10^{-1}$ Pa (1 mTorr). The etched surfaces are sufficiently smooth for the etching process to be used in the production of (Al,Ga)As/(Al,Ga,In)P semiconductor lasers.

20 Claims, 1 Drawing Sheet

METHOD OF ETCHING SEMICONDUCTOR LASER DEVICE HAVING $Al_xGa_{1-x}As$ AND $Al_vGa_{1-(V+Y)}In_YP$ COMPOUND

FIELD OF THE INVENTION

This invention relates to a method of etching an (Al,Ga)As/(Al,Ga,In)P semiconductor layer and to a semiconductor laser device having such a layer.

BACKGROUND OF THE INVENTION

Semiconductor laser devices which emit red light are of great commercial importance, and are used in areas such as data storage. The active region of such a laser device is commonly made using crystalline semiconductors of the (Al,Ga,In)P alloy system. The laser is usually grown on a GaAs substrate, and other GaAs layers may be used in the laser structure.

One common laser structure is the buried ridge laser. Buried ridge lasers are used for optical disc data storage applications which require stable single mode operation. It is known to make a buried ridge laser by means of a procedure involving three semiconductor deposition stages. First, multilayers of (Ga,In)P and (Al,Ga,In)P are deposited on an n-type GaAs substrate to form an n-type cladding region, an active region and a p-type cladding region of the laser. Then, a ridge is etched into the p-type cladding region. Then, n-type GaAs is deposited over the ridge and selectively etched away over the top of the ridge to expose a (Ga,In)P layer at the top of the ridge. Finally, p-type GaAs is deposited over the whole of the structure to bury the ridge, and then metal contact layers are deposited.

A buried ridge laser is disclosed in Japanese patent application No. JP-03 156592 which requires only two semiconductor deposition stages. Multilayers of (Ga,In)P, (Al,Ga,In)P and GaAs are deposited on a GaAs substrate to form the active and cladding regions. Then, after the ridge has been formed by etching, n-type GaAs is deposited over the whole of the structure and etched away from the top of the ridge. Metal contact layers are then deposited. The reduction in the number of semiconductor deposition stages is an advantage for mass production.

The ridge may be etched using either a chemical solution or a plasma. Chemical etching is, however, unsatisfactory where the deposited layers are misoriented. It is advantageous to deposit each layer such that it is slightly misoriented from the nominal (100) crystal direction of the underlying layer, because undesirable "ordering" of the crystal can be suppressed by using such misorientation. Misorientation towards the (110) crystal direction of 4° to 15° and even higher is possible.

A chemical solution will etch different crystal planes at different rates. Ridges formed in misoriented layers by chemical etching are found to be asymmetric, and this degrades the properties of the laser device. In particular, it is found that the peak of the far-field emission pattern is shifted away from the direction normal to the laser facet if the ridge is asymmetric, which creates difficulties in coupling to the output of the laser. In addition, the chemical etching procedure has a number of steps and can be difficult to control in a production process.

Plasma etching does not usually discriminate between crystal planes, so this process can be used to form a ridge in misoriented layers. Other advantages of plasma etching are that it may be accurately controlled, and may be readily incorporated into a production process. Not all plasma etching processes will be appropriate, however, because some cause damage to the remaining semiconductor. in addition, some processes may selectively etch the various layers in the laser device at different rates and this may cause the etched ridge to be "stepped" at the interface between the (Al,Ga,In)P and GaAs layers, rather than having a smooth continuous profile that is required.

"Journal of Vacuum Science and Technology", Vol. B1 pages 1053–1055 (1983), discloses the use of $SiCl_4$ plasmas and $SiCl_4$/Ar plasmas generated in a conventional rf-powered parallel-plate "Reactive Ion Etching" (RIE) system at total pressures of between 1 and 25 mTorr to etch both GaAs and InP. It also discloses that the addition of Ar in $Ar:SiCl_4$ flow ratios of 4:1 , 2:1 and 1:4 eliminated trenching and redeposition observed in InP and resulted in more vertical walls as compared to the use of $SiCl_4$ alone. However, this document discloses only the etching of individual layers and does not examine the profile obtained by etching a sample containing layers of both GaAs and (Al, Ga,In)P.

EP-A-0 547 694 teaches that the above-mentioned $SiCl_4$/Ar plasma etching technique is unsuitable for use on GaAs/(Al,Ga,In)P laser structures because it results in rough surfaces which are undesirable for optoelectronic devices. Such document discloses a onestep plasma etching process for forming the ridge of GaAs/(Al,Ga,In)P lasers using a mixture of $SiCl_4$, Ar and $CH_4$ gases in a rf-powered parallel-plate geometry, wherein the sample being etched is heated to a temperature of between 100° and 150° C. Such document also states that it is essential to add $CH_4$ to the $SiCl_4$/Ar gas mixture if the smooth surfaces required for optoelectronic devices are to be obtained. In a practical etching process, however, the use of $CH_4$ gas is undesirable because of the possibility of polymer formation on the etched surface and/or hydrogen diffusion into the semiconductor.

U.S. Pat. No. 5338394 discloses a method for etching indium-based III-V compound semiconductors in which electron cyclotron resonance (ECR) etching is effected in the presence of $SiCl_4$ and $H_2$ or $CH_4$ in an ECR chamber at any pressure suitable for ECR, but with an expressed preference for use of a pressure between 1 mTorr and 5 mTorr.

EP-A-0607662 discloses a method of selectively etching GaAs over AlGaAs using a mixture of $SiCl_4$, $CF_4$, $O_2$ and an inert gas such as He so as to avoid using a chlorofluorocarbon etchant in a standard plasma etching apparatus, but without any specific disclosure of the pressure employed apart from a reference to etching at 5 mTorr with no He.

SUMMARY OF THE INVENTION

According to a first aspect of the present invention, there is provided a method of etching a(Al,Ga)As/(Al,Ga,In)P semiconductor layer structure using a $SiCl_4$ plasma wherein the etching is performed at a pressure less than $1.33 \times 10^{-1}$ Pa (1 mTorr).

According to a second aspect of the invention, there is provided a method of etching an (Al,Ga)As/(Al,Ga,In)P semiconductor layer structure using an $SiCl_4$ plasma, wherein the $SiCl_4$ plasma contains at least one low atomic mass gas which is inert in the etching environment.

Performing the etching in these ways can enable the production of a ridge having both smooth side walls and a symmetrical cross-section, even if the etching is effected in a misoriented layer structure. We have found that it is not necessary to add $CH_4$ to the gas mixture. Thus, the etching process of the present invention is preferably effected in the absence of $CH_4$ and most preferably. effected in the absence of any polymerisable organic compound. The pressure may typically be about $1.33 \times 10^{-2}$ to $2.66 \times 10^{-2}$ Pa (0.1 to 0.2 mTorr).

We have also found that the etching process can be effected without supplying any additional heat to the structure being etched. The etching process may be effected at a temperature up to about 100° C., it being understood that heating occurs as a result of the chemical and physical processes which take place during the etching process itself. The temperature may even be controlled so as to be below ambient temperature (such as −5° C., or even −10° C). Whilst a temperature in the range of about 10° to 30° C. enables desirable etching characteristics to be produced, the etch rate rises as the temperature increases. Temperatures of about 50° C. to about 70° C., more particularly about 60° C., are preferred. Within the temperature range of about −5° C. to about 80° C., the etch profile has the desired symmetry, which improves in the range 50 to 70° C. However, the exact profile varies, a constant slope being observed at lower temperatures within the range −5° to 80° C. While at higher temperatures within this range, two slopes can be observed, relatively shallow (eg. about 60 to 65 degrees) at the bottom of the etched ridge and relatively steep (up to 90 degrees) at the top of the etched ridge.

Whilst the use of 100% $SiCl_4$ plasma produces the desired smooth etching effect, we have found that a very low pressure 100% $SiCl_4$ plasma tends to be rather unstable. Thus, it is preferred to use an $SiCl_4$/low atomic mass inert gas plasma. The low atomic mass inert gas is found to improve the stability of the plasma without changing the etching characteristics. The low atomic mass gas is preferably He and/or Ne. The use of these low atomic mass inert gases is preferred to Ar since we have found that the use of Ar degrades the quality of etched structure. Accordingly, it is highly preferred to use an Ar-free plasma. The low atomic mass inert gas may be used in an amount of from 0.2 to 4 parts by volume per 1 part by volume of $SiCl_4$.

If desired, the semiconductor structure may be chemically etched after the plasma etching step, to improve further the smoothness of the etched surface.

The plasma is preferably an electron cyclotron resonance plasma or an inductively coupled plasma.

In a further preferred embodiment, the depth of etching is monitored by observing the intensity of a light beam reflected from an etched part of the semiconductor structure. If the semiconductor structure is being etched to form the ridge of a laser device, this allows the height of the ridge to be controlled, thereby controlling the properties of the laser device.

According to a third aspect of the invention, there is provided a semiconductor laser device having a semiconductor layer structure etched by a method according to a first or second aspect of the invention.

BRIEF DESCRIPTION OF THE DRAWINGS

Preferred embodiments of the present invention will now be described by way of an illustrative example with reference to the accompanying drawings, in which.

DETAILED DESCRIPTION OF THE INVENTION

Figure 1:
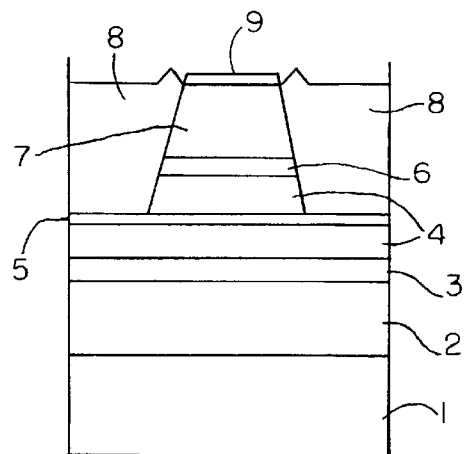
FIG. 1 shows the structure of a buried ridge laser.

The buried ridge laser shown in FIG. 1 has an n-type GaAs substrate 1 upon which is deposited a layer structure in which each layer has a misorientation of 15° towards the (110) crystal direction relative to the (100) crystal direction of the underlying layer. Such layer structure includes an $(Al_{0.7}Ga_{0.3})_{0.5}P$ n-type cladding layer 2 deposited on the substrate 1. A multi-quantum well $Ga_{0.6}In_{0.4}P$ active layer region 3 including barrier layers and optical guide layers is grown on the n-type cladding layer 2. An $(Al_{0.7}Ga_{0.3})_{0.5}In_{0.5}P$ p-type cladding layer 4, a GaInP etch-stop layer 5, a GaInP layer 6 and a GaAs contact layer 7 are then grown in turn over the active region 3. Next, the structure is etched to form a ridge, and the ridge is buried with an n-type GaAs layer 8. The n-type GaAs layer 8 is then etched away from the top of the ridge, and contacts 9, 9' are deposited.

A mask is formed on the surface of the semiconductor structure before the laser structure is etched, so that the mask defines the ridge of the laser. Any suitable etch-resistant and non-contaminating material can be used for the mask, for example alumina ($Al_2O_3$) or silicon dioxide ($SiO_2$). The mask can be formed by conventional methods, such as electron beam evaporation or plasma-enhanced chemical vapour deposition, or spin coating. The pattern of the mask is then defined, eg. by a lithographic technique. Alternatively, a photolithographic material, eg. a photoresist, may be used for the mask.

Figure 2:
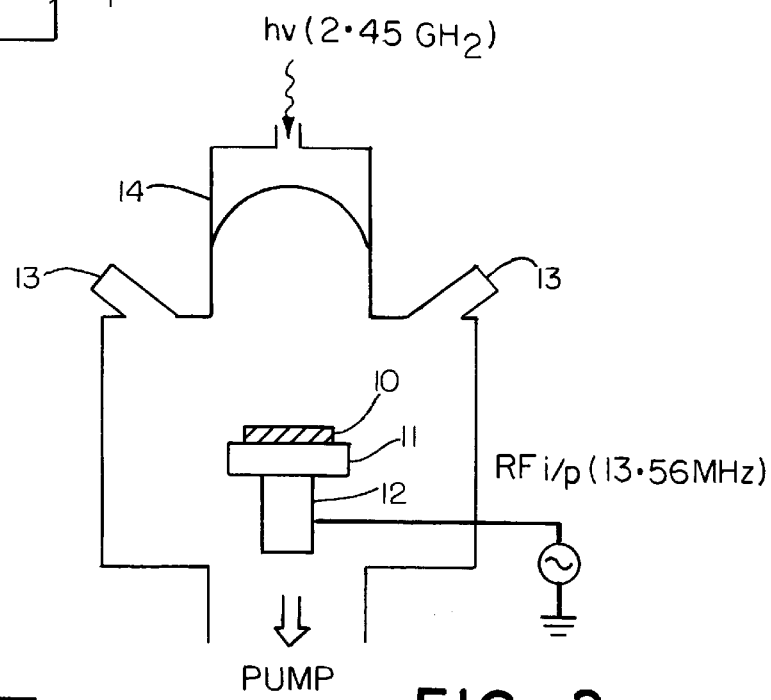
FIG. 2 is a schematic diagram of an apparatus for performing the method of this invention.

The etching is carried out using silicon tetrachloride gas ($SiCl_4$) in an ECR (electron cyclotron resonance) plasma etching system. The etching system is shown schematically in FIG. 2. The sample 10 is clamped to a sample holder 11 which is supported on an electrode assembly 12. Reference 13 denotes an optical port.

It is unnecessary to heat the sample to produce a symmetrical profile. However, the surface quality improves with increased temperature and the etch rate can be fixed by maintaining a given temperature. $SiCl_4$ and He are introduced into the etching chamber 14 at respective flow rates of 6 and 3 sccm (standard cubic centimeters per minute), and the pressure in the etching chamber is kept in the region of $1.33 \times 10^{-2}$ to $2.66 \times 10^{-2}$ Pa (0.1 to 0.2 mTorr) by pumping on the etching chamber.

The plasma in the ECR source is maintained by supplying 200 W microwave power at a frequency of 2.45 GHz. The resonance condition is maintained by an electromagnet (not shown) which surrounds the source. The energy of the ions etching the sample is partially determined by a DC potential set up as a result of 13.56 MHz radio frequency power supplied to the electrode assembly. The best results are obtained when the DC potential is kept approximately constant and in the range 200–250 V.

After the plasma etching is complete, a brief chemical etching step can be performed to further improve the smoothness of the surface before GaAs is deposited to bury the ridge. This brief etch does not substantially change the shape of the ridge. Concentrated sulphuric acid is a suitable etchant.

The height of the ridge produced by the etching affects the properties of the laser, so it is desirable to monitor the etching. This can be done by directing a laser beam (not shown) onto a part of the surface of the semiconductor laser which is being etched. Interference occurs between light reflected by the surface of the sample being etched and light reflected at the underlying interface. The interference causes oscillations in the reflected light as the surface of the sample is etched. These oscillations can be detected and used to determine the remaining thickness of the underlying layer and hence the depth of etching. In a similar manner, ellipsometry may also be used to monitor the depth of etching.

Further examples of the present invention will now be described.

The structure shown in FIG. 1 and described hereinbefore was made using the techniques described hereinbefore. Etching of the structure to form the ridge was performed by plasma etching using $SiCl_4$ in an ECR of the type shown in FIG. 2. A mask of $SiO_2$ was used and plasma etching was stopped marginally above the etch stop layer 5. The etch stop layer 5 is effective in chemical or "wet" etching to improve the surface smoothness.

Figure 3A:
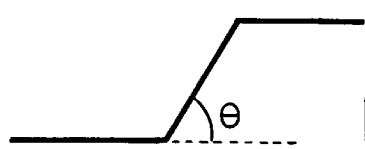
FIG. 3 illustrates three examples labelled A, B and C of etch profiles which may be achieved by the method of the invention.
Figure 3B:
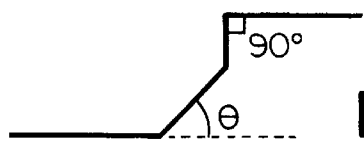
Figure 3C:
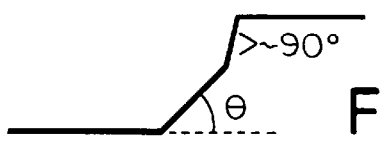

The following table specifies the etch parameters which were used to make Various samples. The columns of this table headed "profile type" and "angle θ" refer to the resulting profiles which were achieved with the corresponding set of parameters and which are illustrated in FIG. 3.

Etch Parameter Table

| gas SiCl4 sccm | gas He sccm | nominal temp °C. | pressure mT | RF power W | μwave power W | resulting bias V | profile type | angle θ |
|---|---|---|---|---|---|---|---|---|
| 6 | 0 | 80 | 0.1–0.2 | 250 | 200 | 210 | B | ≈64 |
| 6 | 3 | 60 | 0.1–0.2 | 250 | 200 | 210 | B | ≈64 |
| 6 | 0 | 60 | 0.1–0.2 | 250 | 200 | 210 | B | ≈64 |
| 6 | 0 | 20 | 0.1–0.2 | 250 | 200 | 210 | A | ≈64 |
| 6 | 0 | −5 | 0.1–0.2 | 250 | 200 | 210 | A | ≈64 |
| 6 | 3 | 25 | 2 | 250 | 200 | 205 | B | ≈45 |
| 6 | 3 | 60 | 2 | 230 | 200 | 205 | C | ≈45 |

Although Helium (He) was used to make these samples, other gases of low atomic weight which are substantially inert in the etching environment may be used. Of the "inert" or "noble" gases, argon (Ar) causes unacceptable damage, He causes substantially no damage, and neon (Ne) may cause more damage than He but less than Ar and may therefore be used (alone or with He).

The profile illustrated at 8 In FIG. 3 with an angle θ of around 60° is most appropriate for making a semiconductor laser. The optimum set of parameters is considered to be that specified in the second row of the table, namely gas flow rates of 6 sccm for $SiCl_4$ and 3 sccm for He, a temperature of 60° C. and a pressure of 0.1 to 0.2 m Torr. Each parameter was varied in turn from that of the optimum set (with the other parameters being as specified) with the following results.

Temperature

The process was successfully performed for temperatures in the range −5° to 100° C. It is suspected that undesirable surface and ridge features may occur below about −10° C. The experimental system did not permit testing above 100° C.

Pressure

The process was performed for pressures in the range 0.1 to 2 m Torr and achieved acceptable ridge symmetry. The experimental system did not permit testing below 0.1 m Torr. The ridge slope was undesirable for pressures higher than about 2 m Torr.

Gas

The process was successful for a flow rate of 6 sccm of $SiCl_4$ in that the plasma was stable Higher flow rates give higher than the minimum pressure. The He is used to stabilise the plasma at the lowest flow rates at its flow rate can be varied as mentioned hereinbefore.

RF

The process was performed successfully for RF powers between 250 and 320 W with some variation in surface quality.

Microwave

Increasing the microwave power was found to result in mask stripping.

Many variations of the above-described examples are possible. For example, rather than adding He gas to the $SiCl_4$ plasma, Ne may be added, or $SiCl_4$ alone may be used.

While the embodiments described above used an electron cyclotron resonance plasma, it is considered possible to use an inductively coupled plasma source.

What is claimed is:

1. A method of etching an (Al,Ga)As/(Al,Ga,In)P semiconductor layer structure comprising a $Al_xGa_{1-x}As$ layer ($0 \leq x \leq 1$) and a $Al_vGa_{1-(v+y)}In_yP$ layer ($0 \leq v \leq 1$, $0 \leq y \leq 1$ and $v+y \leq 1$), comprising a plasma etching step for etching the (Al,Ga)As/(Al,Ga,In)P semiconductor layer structure using an $SiCl_4$ plasma, wherein the plasma etching step is performed at a pressure less than about $1.33 \times 10^{-1}$ Pa (about 1 mTorr).

2. A method of etching according to claim 1, wherein the $SiCl_4$ plasma contains at least one low atomic mass gas which is inert in the plasma during the plasma etching step.

3. A method of etching according to claim 2, wherein the at least one low atomic mass gas is selected from He and Ne.

4. A method of etching according to claim 1, wherein the plasma etching step is performed at a pressure of between about $1.33 \times 10^{-2}$ Pa and about $2.66 \times 10^{-2}$ Pa (between about 0.1 mTorr and about 0.2 mTorr).

5. A method of etching according to claim 1, further comprising a step of chemically etching the semiconductor layer structure after the plasma etching step.

6. A method of etching according to claim 1, further comprising a step of monitoring a depth of an etched part of the semiconductor layer structure by observing an intensity of a light beam reflected from the etched part.

7. A method of etching according to claim 1, wherein the semiconductor layer structure forms a part of a buried ridge structure.

8. A method of etching an (Al,Ga)As/(Al,Ga,In)P semiconductor layer structure comprising a $Al_xGa_{1-x}As$ layer ($0 \leq x \leq 1$) and a $Al_vGa_{1-(v+y)}In_yP$ layer ($0 \leq v \leq 1$, $0 \leq y \leq 1$ and v+y≦1), comprising a plasma etching step for etching the (Al,Ga)As/(Al,Ga,In)P semiconductor layer structure using an $SiCl_4$ plasma contains at least one low atomic mass gas which is inert in the plasma during the plasma etching step.

9. A method of etching according to claim 8, wherein the at least one low atomic mass gas is selected from He and Ne.

10. A method of etching according to claim 8, wherein the plasma etching step is performed at a pressure of substantially about $1.33 \times 10^{-1}$ Pa (about 1 mTorr).

11. A method of etching according to claim 8, wherein the $SiCl_4$ plasma is free of Ar.

12. A method of etching according to claim 8, wherein the $SiCl_4$ plasma is free of $CH_4$.

13. A method of etching according to claim 8, wherein the plasma etching step is effected at a temperature of up to about 100° C.

14. A method of etching according to claim 13, wherein the temperature is not less than about −10° C.

15. A method of etching according to claim 14, wherein the plasma etching step is effected at a temperature in the range of about −5° C. to about 80° C.

16. A method of etching according to claim 15, wherein the temperature is in the range of about 50° C. to about 70° C.

17. A method of etching according to claim 16, wherein the temperature is about 60° C.

18. A method of etching according to claim 8, comprising a step of chemically etching the semiconductor layer structure after the plasma etching step.

19. A method of etching according to claim 8, further comprising a step of monitoring a depth of an etched part of the semiconductor layer structure by observing an intensity of a light beam reflected from the etched part.

20. A method of etching according to claim 8, wherein the semiconductor layer structure forms a part of a buried ridge structure.

* * * * *